US006882259B1

United States Patent
Klocinski et al.

(10) Patent No.: US 6,882,259 B1
(45) Date of Patent: Apr. 19, 2005

(54) USING A CIRCUIT BOARD FOR IGNITION COIL INTERNAL CONNECTIONS

(75) Inventors: James J. Klocinski, Saline, MI (US); Michael T. Nation, Ypsilanti, MI (US); William D. Walker, Saline, MI (US); Robert C. Bauman, Brighton, MI (US); Rick S. Burchett, Ypsilanti, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 10/839,986

(22) Filed: May 5, 2004

(51) Int. Cl.[7] .............................................. H01F 27/02
(52) U.S. Cl. ............................ 336/90; 336/92; 336/96; 123/634
(58) Field of Search ...................... 336/65, 83, 90–96, 336/107, 192, 198; 123/634, 635, 647

(56) References Cited

U.S. PATENT DOCUMENTS

| 4,336,785 | A | | 6/1982 | Newberry |
| 4,406,271 | A | | 9/1983 | Wolf |
| 5,484,965 | A | | 1/1996 | Woychik |
| 5,534,781 | A | * | 7/1996 | Lee et al. .................... 324/380 |
| 5,907,243 | A | * | 5/1999 | Goras et al. ................. 324/388 |
| 6,496,384 | B1 | | 12/2002 | Morales et al. |
| 6,622,711 | B1 | | 9/2003 | Skinner et al. |
| 6,655,367 | B1 | * | 12/2003 | Ohkama et al. ............. 123/634 |
| 6,758,200 | B1 | * | 7/2004 | Hageman et al. ........... 123/647 |
| 2002/0012230 | A1 | | 1/2002 | Oishi et al. |

FOREIGN PATENT DOCUMENTS

| DE | WO 92/13354 | 8/1992 |
| FR | 2817919 | 6/2002 |
| JP | 60022457 A | 2/1985 |
| JP | 06224058 A | 8/1994 |
| JP | 08082274 A | 3/1996 |
| JP | 08335524 A | 12/1996 |
| JP | 2000260641 A | 9/2000 |
| JP | 2002013458 A | 1/2002 |

* cited by examiner

Primary Examiner—Tuyen T. Nguyen
(74) Attorney, Agent, or Firm—Brinks Hofer Gilson & Lione

(57) ABSTRACT

A circuit board for an ignition coil in an internal combustion engine is provided. The ignition coil is in electrical connection with a control module and a spark plug having a pair of gap posts. The ignition coil includes a primary winding having an electrical current, a secondary winding in electrical connection with the spark plug and configured to induce a second electrical current between the gap posts, and an ionization current sensing integrated circuit configured to generate an ionization signal based on the secondary current between the gap posts. The ignition coil also includes a circuit board having an ionization connection in electrical connection with the secondary winding and with the ionization current sensing integrated circuit.

20 Claims, 3 Drawing Sheets

USING A CIRCUIT BOARD FOR IGNITION COIL INTERNAL CONNECTIONS

BACKGROUND

The present invention relates generally to ignition coils for a spark-ignition internal combustion engine. More specifically, the invention relates to a circuit board for an ignition coil, and the electrical connection between components of the ignition coil.

Ignition coils typically contain the internal components such as a core assembly, a primary winding, a secondary winding, and at least one bobbin, all disposed within an ignition coil housing. The core assembly is typically constructed of steel lamination stacks upon which the primary and secondary windings of the ignition coil are mounted. The primary and secondary windings are typically comprised of copper wire and they are each wound around their respective bobbin. This secondary winding is in electrical connection with a spark plug, and the spark plug includes a pair of gap posts. The spark plug gap is located within the combustion chamber in order to ignite fuel and cause engine pistons to move downward in a power stroke, thereby powering the vehicle.

Ignition coils are also typically in electrical connection with a control means, such as a powertrain control module (PCM). One function of the PCM is to send pulse waves to a transistor that is in connection with the ignition coil in order to control the amount of current flowing through the primary windings. If the current flowing through the primary windings is suddenly interrupted, an electromagnetic field is induced in the secondary windings and causes a high-voltage current to flow across the spark plug gap and create the spark in the ignition chamber. Therefore, by controlling the timing of the pulse wave sent to the transistor, the PCM controls the ignition timing typically related to the angular position of the piston in the cylinder being fired.

Another function of the PCM is to run an engine at its maximum brake torque (MBT) spark timing in order to improve fuel economy. A related function of the PCM is to avoid knock, pinging, and misfire or partial-burn during the operation of an internal combustion engine. PCMs are typically in working connection with an MBT timing controller in order to determine and control the MBT timing, to limit misfire and partial burn, and to limit engine knock and pinging. One type of MBT timing controller accomplishes these functions by generating and utilizing ionization signals based on the current across the spark plug gap.

In order to create working electrical connections between the PCM, the transistor, and the MBT timing controller and in order to create working electrical connections within various components of each of these systems, electrical connectors are utilized. These connectors are typically leadframes comprised of metal such as brass or copper. The metal leadframes typically must be formed to a desired size and shape, often requiring multiple bends to the leadframes. Metal leadframes are typically relatively expensive due to the tooling and stamping operations typically used during manufacturing.

As seen from the above, it is desirable to provide an improved means of connecting the ignition coil internal circuitry and interior components to the exterior power supply and exterior controls.

SUMMARY

In overcoming the disadvantages and drawbacks of the known technology, the current invention provides an assembly that improves the electrical connections in an ignition coil.

In one aspect of the invention, an ignition coil is in electrical connection with a control module, an electrical power supply, and a spark plug having a pair of gap posts. The ignition coil includes a primary winding in electrical connection with the electrical power supply. The ignition coil further includes a secondary winding located adjacent to the primary winding and in electrical connection with the spark plug such that an electrical current is induced between the spark plug gap posts based on the presence of the time-varying electrical current through the primary winding. The ignition coil further includes an ionization current sensing integrated circuit in connection with the secondary winding in order to generate an ionization signal based on the electrical current between the spark plug gap posts. The ignition coil further includes a circuit board having an ionization connection electrically connecting the secondary winding and an ionization current sensing integrated circuit.

In another aspect of the present invention, the circuit board further includes a power supply connection electrically connecting the electrical power supply and the primary winding. The power supply connection transmits the electrical current from the electrical power supply to the primary winding.

In yet another aspect of the present invention, the circuit board further includes a control signal connection electrically connecting the control module and the ionization current sensing integrated circuit. The control signal connection transmits a control signal from the control module to the ionization current sensing integrated circuit.

In another aspect of the present invention, the circuit board includes a feedback signal connection electrically connecting the ionization current sensing integrated circuit and the control module. The feedback signal connection transmits a feedback signal from the ionization current sensing integrated circuit to the control module.

In yet another aspect of the present invention, the circuit board includes a transistor connection electrically connecting the primary winding and a transistor. The transistor connection transmits the electrical current from the primary winding to the transistor.

In another aspect of the present invention, the circuit board includes a ground connection that is electrically grounded. The ground connection provides a first electrically grounded connection for the ionization current sensing integrated circuit and a second electrically grounded connection for the transistor. At least one of the ionization current sensing integrated circuit and the transistor is located within a case, and the ground connection provides a third electrically grounded connection for the case.

DETAILED DESCRIPTION

Figure 1:
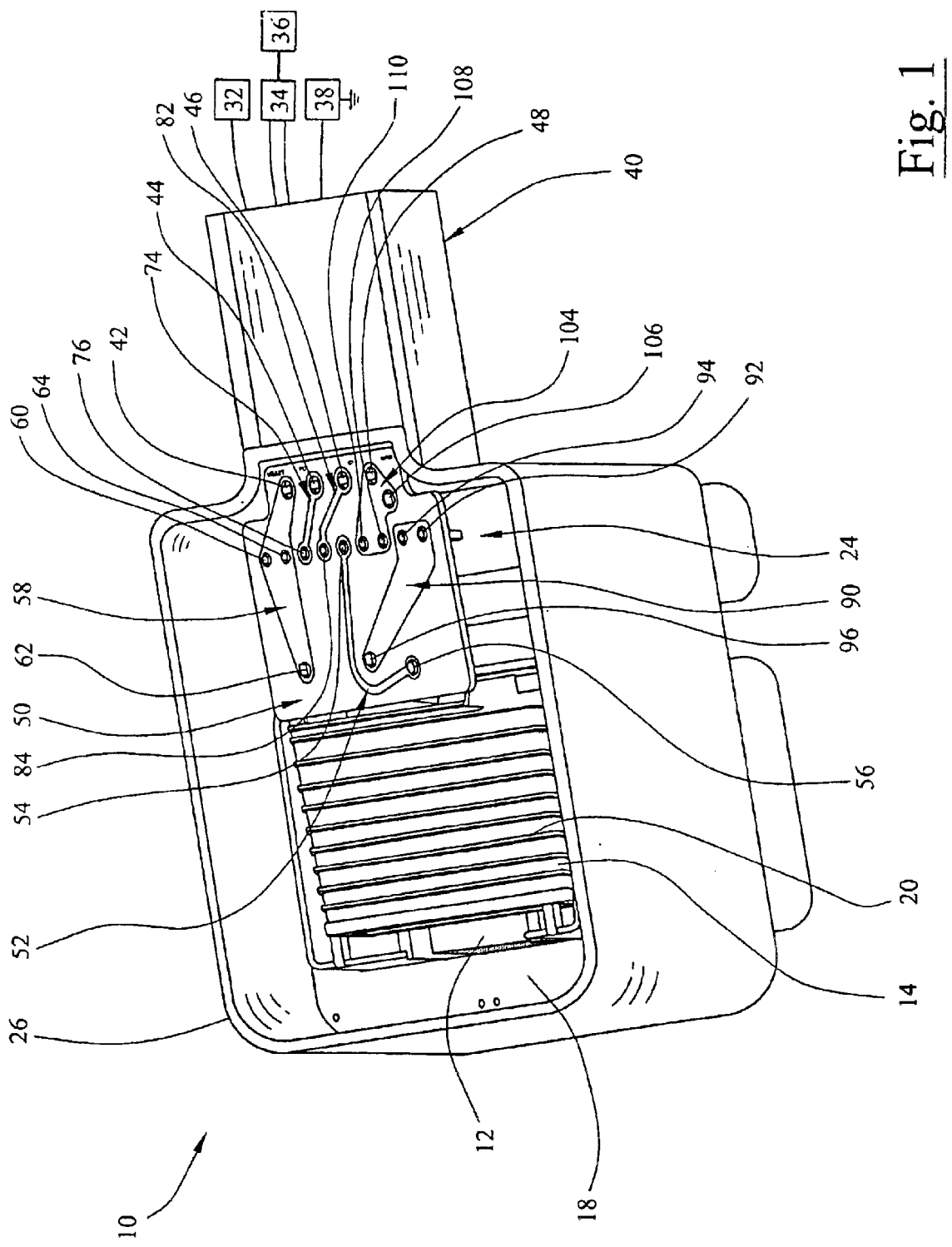
FIG. 1 is an isometric view of an ignition coil including a circuit board and embodying the principles of the present invention.

Referring now the drawings, FIG. 1 shows and ignition coil 10 having an inner core 12 with a primary winding 16 (shown in FIG. 3) surrounds the inner core 12. A secondary winding 14 surrounds the primary winding 16, and an outer core 18 surrounds the secondary winding 14. The inner core 12 and the outer core 18 are preferably constructed of steel lamination stacks, but it will be recognized that any high permeability material may be used. Additionally, the inner core 12 and outer core 18 may be constructed in solid or other non-laminate.

The primary winding 16 is wrapped around a primary bobbin (not shown) and the secondary winding 14 is wrapped around a secondary bobbin 20. The primary bobbin and the secondary bobbin 20 serve as dielectric barriers separating the respective windings 16, 14 from each other and from the inner and outer cores 12, 18. The secondary winding 14 is in electrical communication with a spark plug 22 (shown in FIG. 3). Preferably, the inner and outer cores 12, 18, primary and secondary windings 16, 14, and the respective bobbins 20 are all disposed within an ignition coil housing 26 and are all surrounded by a dielectric material (not shown) in a potting operation generally known in the art. The housing 26 is preferably comprised of plastic. The dielectric material is preferably an epoxy that is first poured into the housing 26 in a liquid state and then permitted to harden in order to protect and insulate the ignition coil 10 components.

The ignition coil 10 shown in FIG. 1 also includes a case 24 disposed within the ignition coil housing 26 and located adjacent to the outer core 18. The case 24 is preferably comprised of metal and contains an ionization current sensing integrated circuit 28 (shown in FIG. 3) and a transistor such as an insulated gate bipolar transistor 30 (shown in FIG. 3). The functions of the ionization current sensing integrated circuit (ICSI circuit) 28 and the insulated gate bipolar transistor (IGBT) 30 will be discussed in more detail below.

The ignition coil 10 shown in FIG. 1 is in electrical communication with external components, such as a battery 32, a powertrain control module 34, an internal combustion engine 36, and an electrically grounded section of the vehicle 38, such as the vehicle harness (not shown). The battery 32, the powertrain control module (PCM) 34, and the electrically grounded section of the vehicle 38 are each connected to respective upstanding pins in the ignition coil 10 via a plurality of lead wires imbedded within a front section 40 of the housing 26 in order to connect the external components 32, 34, 38 to the ignition coil 10 components. More specifically, a battery upstanding pin 42 connects to a leadwire (not shown) extending from the interior of the ignition coil 10 through the front section 40 of the housing 26 in order to form an electrical connection with the battery 32. Also, a control signal upstanding pin 44 connects to a leadwire (not shown) extending from the interior of the ignition coil 10 through the front section 40 of the housing 26 in order to form an electrical connection with the powertrain control module 34. Furthermore, a feedback upstanding pin 46 connects to a leadwire (not shown) extending from the interior of the ignition coil 10 through the front section 40 of the housing 26 in order to form an electrical connection with the powertrain control module 34. Additionally, grounding upstanding pin 48 connects to a leadwire (not shown) extending from the interior of the ignition coil 10 through the front section 40 of the housing 26 to provide various ignition coil components with a connection with the electrically grounded section 38 of the automobile, as will be discussed in further detail below.

In one aspect of the present invention, each of the upstanding pins 42, 44, 46, 48 forms an electrical connection with various components of the ignition coil 10, and a circuit board 50 is located within the housing 26 of the ignition coil 10 in order to simplify these electrical connections. The circuit board 50 is preferably a printed circuit board comprised of appropriate materials known in the art. The circuit board 50 may include connections to a greater or a lesser number of lead wires than the four upstanding pins 42, 44, 46, 48 discussed above.

Figure 2:
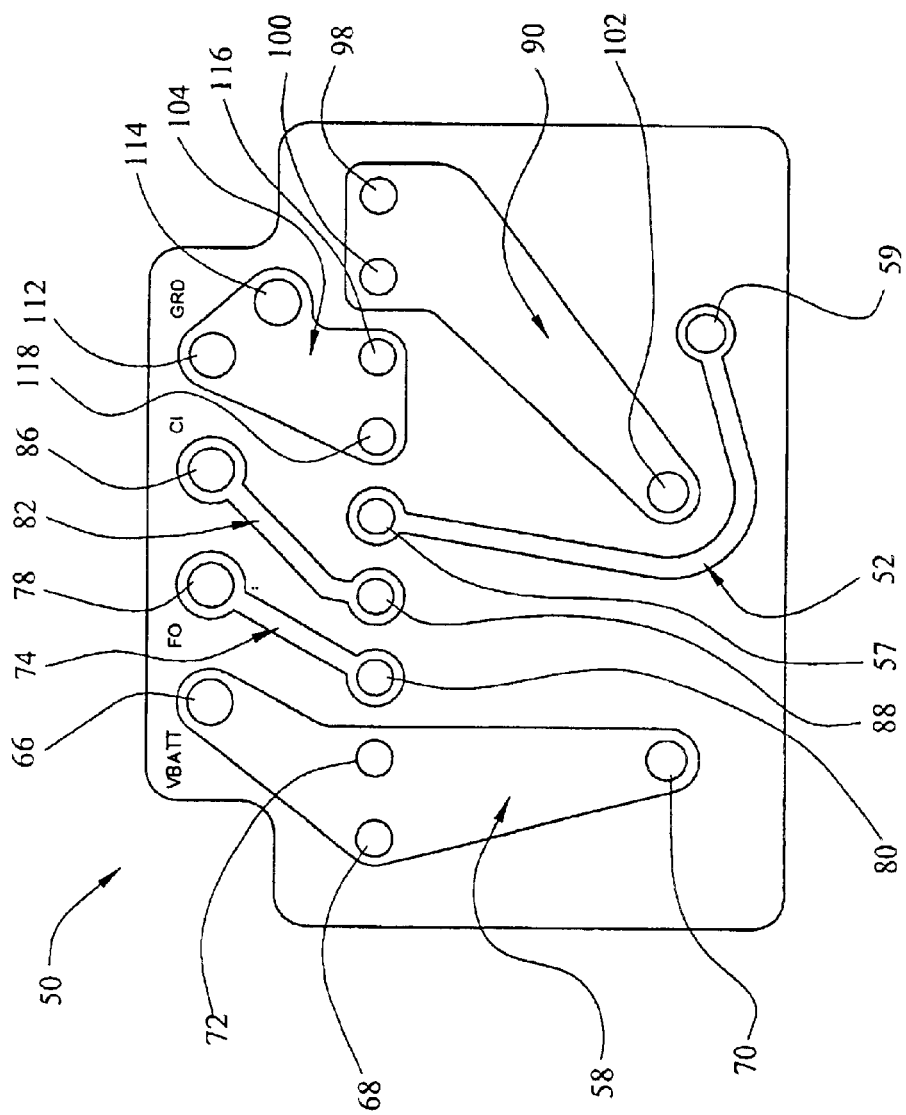
FIG. 2 is a close-up view of the circuit board shown in FIG. 1.

The circuit board 50 shown in FIGS. 1 and 2 includes an ionization connection 52, connecting the ICSI circuit 28 with the secondary winding 14 via a first ICSI upstanding pin 54 and a secondary winding upstanding pin 56. As shown in FIGS. 1 and 2 each of the upstanding pins 54, 56 extends into a respective opening 57, 59 of the circuit board 50 in order to complete the ionization connection 52. The connection 52 preferably includes a thin conductive sheet coupled to the circuit board 50. More specifically, the connection 52 is preferably a thin metal sheet, commonly known as a trace. The connection 52 may be embedded within the circuit board 50, or it may be connected to the surface of the circuit board 50.

Furthermore, the circuit board 50 shown in FIGS. 1 and 2 includes a battery connection 58, connecting the battery upstanding pin 42 to the ICSI circuit 28 via a second ICSI upstanding pin 60 and connecting the primary winding 16 to the battery upstanding pin 42 via a first primary winding upstanding pin 62. The battery connection 58 may also include a connection to an additional ICSI upstanding pin 64 which is redundant or cumulative with the second ICSI upstanding pin 60, as will be discussed further below. The battery upstanding pin 42, the second ICSI upstanding pin 60, the first primary winding upstanding pin 62, and the redundant ICSI upstanding pin 64 are respectively inserted within four openings 66, 68, 70, 72 in the circuit board 50 in order to complete the battery connection 58.

The circuit board 50 shown in FIGS. 1 and 2 further includes a control signal connection 74, electrically connecting the ICSI circuit 28 to the PCM 34 via the control signal upstanding pin 44 and a third ICSI upstanding pin 76. Each of the upstanding pins 44, 76 is inserted into a respective opening 78, 80 of the circuit board 50 in order to complete the control signal connection 74.

Additionally, the circuit board 50 shown in FIGS. 1 and 2 includes a feedback signal connection 82, connecting the PCM 34 to the ICSI circuit 28 via the feedback upstanding pin 46 and a fourth ICSI upstanding pin 84. The respective upstanding pins 46, 84 are inserted into respective openings 86, 88 in the circuit board 50 in order to complete the feedback signal connection 82.

Furthermore, the circuit board 50 shown in FIGS. 1 and 2 includes an IGBT connection 90, connecting the IGBT 30 to the primary winding 16. The IGBT connection 90 preferably includes a first IGBT upstanding pin 92 and a second primary winding upstanding pin 96. More preferably, the IGBT connection 90 includes an additional IGBT upstanding pin 94 which is redundant and/or cumulative to the first IGBT upstanding pin 92 as will be discussed further below. Each of the three respective upstanding pins 92, 94, 96 is inserted into a respective opening 98, 100, 102 in the circuit board 50 in order to complete the IGBT connection 90.

The circuit board 50 shown in FIGS. 1 and 2 further includes a ground connection 104, connecting the IGBT 30 and the case 24 to the electrically grounded section 38 of the motor vehicle. The ground connection 104 connects the grounding upstanding pin 48 to a case upstanding pin 106 and to a second IGBT upstanding pin 108. The ground connection is also preferably connected to an additional IGBT upstanding pin 110, which is redundant and/or cumulative to the second IGBT upstanding pin 108 as will be discussed further below. Each of the respective upstanding pins 48, 106, 108, 110 is inserted into a respective opening 112, 114, 116, 118 in the circuit board 50 in order to complete the ground connection 104.

During manufacturing of the ignition coil 10, each of the components, such as the primary winding 16, the secondary winding 14, the ICSI circuit 28, the IGBT 30, and the leadwires connected to the four upstanding pins 42, 44, 46, 48 are pre-formed in order to properly align with the circuit board 50. More specifically, the case 24 and the housing are shaped such that nine upstanding pins 60, 64, 76, 84, 54, 110, 108, 94, 92 extend from the case in a pattern that matches the pattern of the nine respective openings in the circuit board 68, 72, 80, 88, 57, 118, 104, 100, 98. In FIGS. 1 and 2, this pattern is a straight line with equidistant upstanding pins and openings.

Additionally, the front section 40 of the housing is preferably shaped such that the positions of the four upstanding pins 42, 44, 46, 48 will correspond to the positions of the four respective openings 66, 78, 86, 112 in the circuit board 50. Preferably, the leadwires are molded into the housing 26 during manufacturing in order to properly position the four upstanding pins 42, 44, 46, 48. Alternatively, the front section is separately manufactured and the leadwires are later inserted into the front section.

Similarly, the primary winding 16 and secondary winding 14 are preferably pre-formed such that the respective upstanding pins 62, 56, 96 are properly positioned when the primary and secondary windings 16, 14 are inserted into the housing 26.

In order to effectively form connections between the respective upstanding pins discussed above and the respective openings in the circuit board 50 discussed above, each of the upstanding pins discussed above preferably extends generally perpendicularly to the circuit board 50 into the respective openings. Additionally, the upstanding pins are preferably soldered to the circuit board 50 by a laser or optical soldering process, or another appropriate method, such as wave soldering. All of the upstanding pins are preferably soldered to the circuit board 50 at the same time after the circuit board 50 has been inserted into the ignition coil housing 26. Alternatively, the respective upstanding pins may be soldered to the circuit board 50 before the components are inserted into the ignition coil housing 26.

The upstanding pins are preferably comprised of an appropriately conductive metal, such as brass or copper. However, any appropriate material may be used. Additionally, the connections 58, 74, 82, 52, 104, 90 are preferably comprised of an appropriately conductive metal, but any appropriate material may be used.

After the circuit board 50 is properly connected to the respective upstanding pins, the circuit board 50 may be covered with a potting material in a fashion similar to the earlier described hardening epoxy. The potting material (not shown) used to cover the circuit board 50 is preferably the same as earlier described potting material used to cover the windings 14, 16, and the case 24. Alternatively, a separate potting material may be used.

The circuit board 50 discussed is only one possible embodiment of the present invention. A circuit board including additional openings for connection with additional upstanding pins may be used. Similarly, a circuit board having fewer openings for connection with fewer upstanding pins may also be used.

Figure 3:
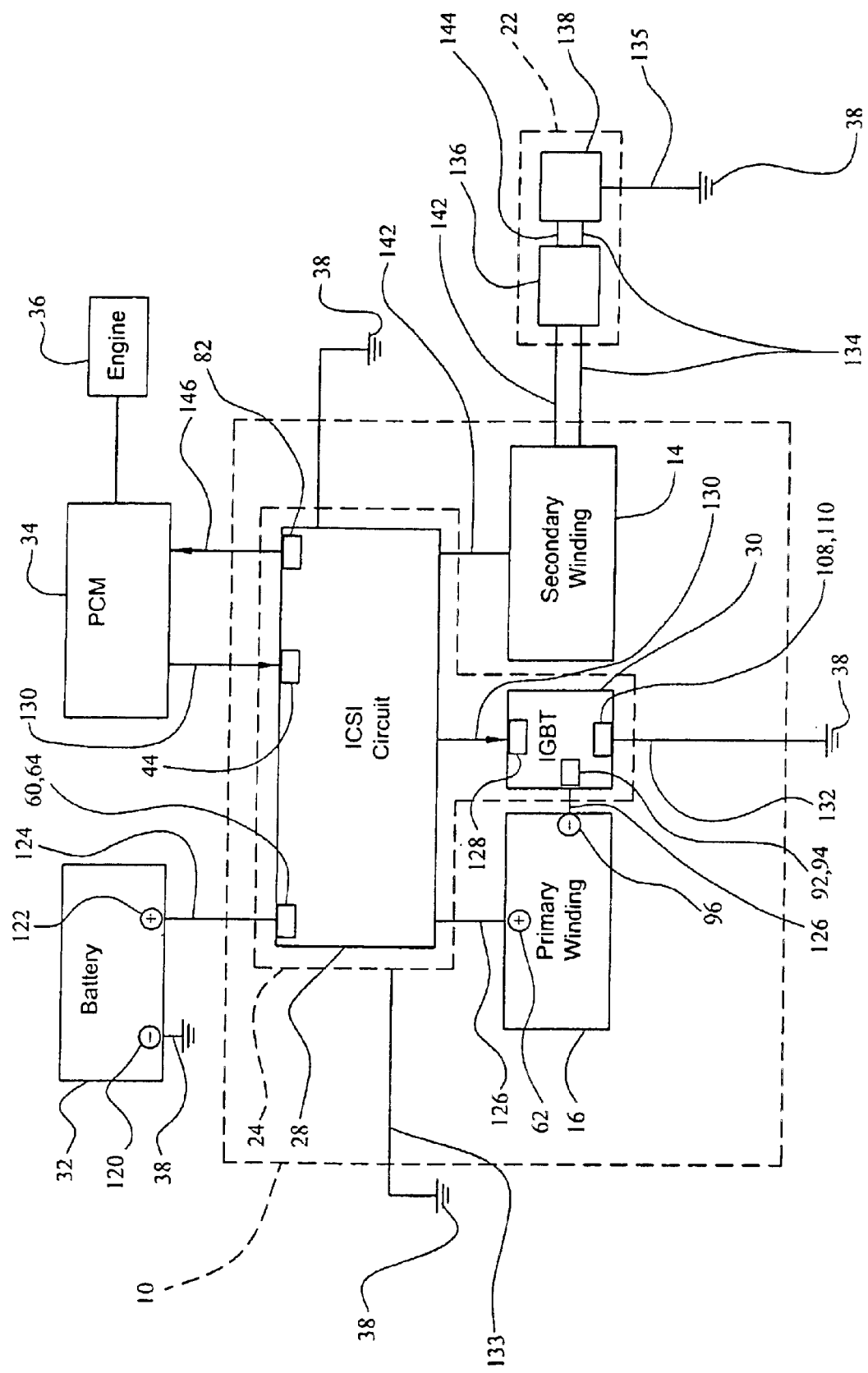
FIG. 3 is a flowchart for the ignition coil shown in FIG. 1 in connection with a battery, a control module, and an internal combustion engine.

Referring now to FIG. 3, the operation of one embodiment of the ignition coil 10 will be discussed in more detail.

The battery 32 includes a negative upstanding pin 120 in connection with the electrically grounded section 38 and a positive upstanding pin 122 in connection with the ICSI circuit 28 via the battery connection 58 shown in FIG. 1. The battery current 124 flows from the positive upstanding pin 122 of the battery 32 into the ICSI circuit 28 via the second ICSI upstanding pin 60 and the redundant ICSI upstanding pin 64. The two upstanding pins 60, 64 are redundant in order to prevent overload of the upstanding pins 60, 64. Therefore, the two upstanding pins 60, 64 may be combined into a single upstanding pin as appropriate. Battery current 124 enters the ICSI circuit 28, as will be discussed in further detail below, and current also flows through and enters the primary winding 16 as a primary winding current 126.

The primary winding current 126 flows into the primary winding 16 via the first primary winding upstanding pin 62, which is the positive upstanding pin of the primary winding 16, and into the IGBT 30 via the IBGT connection 90 shown in FIG. 1. More specifically, the primary winding current 126 exits the primary winding via the second primary winding upstanding pin 96, which is the negative upstanding pin of the primary winding 16, and enters the IGBT 30 via the first IGBT upstanding pin 92 and the redundant IGBT pin 94.

The IGBT is a solid state switching device, such as a hybrid transistor or a MOSFET transistor generally known in the art. More specifically, the first IGBT upstanding pin 92 and the redundant IGBT pin 94 act as a collector, the second IGBT upstanding pin 108 and the redundant IGBT pin 110 act as an emitter, and an additional IGBT upstanding pin 128 that is connected to the ICSI circuit 28 serves as the base and the gate.

During operation of the ignition coil 10, the IGBT acts as an on/off switch to the primary winding current 126. More specifically, the PCM 34 sends a pulse wave control signal 130 to the IBGT 30 via the ICSI circuit 28 and the control signal upstanding pin 44. The control signal 130 next enters the IGBT from the ICSI circuit 28 via the base/gate 128. The control signal 130 is a high/low signal, having a first voltage that is relative higher than a second voltage. For example, the control signal 130 in FIG. 3 has a high voltage approximately equal to 5 Volts and a low voltage approximately equal to 0 Volts. When the control signal is high, it connects the collector (first IBGT upstanding pin 92 and redundant IGBT pin 94) to the emitter (second IGBT upstanding pin 108 and redundant IGBT pin 110) thus completing the electrical connection between the battery 32 and the IGBT 30 and allowing the primary winding current 126 to flow through an electrically grounded connection 132 between the IGBT 30 and the electrically grounded section 38 of the vehicle. When the control signal 130 is low, the collector 92, 94 is not in electrical connection with the emitter 108, 110 and no electrical current flows through the primary winding 16.

The case 24 containing the ICSI circuit 28 and the IGBT 30 is preferably comprised of metal, and therefore electromagnetic fields may be generated in the case 24. Therefore, a second electrically grounded connection 133 is preferably provided between the case 24 and the electrically grounded section 38 of the vehicle. The ICSI circuit 28 may also include a connection to the electrically grounded section 38 of the vehicle.

Referring back to FIG. 1, the operation of secondary winding 14 will now be discussed in more detail. The secondary winding 14 is located proximal to the primary winding 16. More specifically, the primary winding 16 is preferably located within the secondary winding 14. As the primary winding current 126 flows through the primary winding 16, an electromagnetic field (not shown) builds up in the inner and outer cores 12, 18. When the PCM 34 switches its signal from high to low (5 Volts to 0 Volts) the magnetic field in the cores 12, 18 collapses rapidly, causing a high-voltage 134 to be induced in the secondary winding 14. The high voltage 134 may be up to 50,000 Volts.

As discussed earlier, the spark plug 22 is in electrical connection with the secondary winding 14. The spark plug 22 preferably includes a first post 136 in electrical connection with the secondary winding and a second post 138 spaced apart from the first post 136 and in electrically connection with the electrically grounded section of the motor vehicle 38. Due to its high voltage characteristics, the high voltage current 134 is able to jump the gap between the first post 136 and the second post 138 in order to complete the connection between the secondary winding 14 and the second post 138 and form a third electrically grounded connection 135 with the electrically grounded section 38 of the vehicle. As the high voltage 134 jumps the gap between the respective gap posts 136, 138 a spark is formed and the fuel vapors located within the combustion chamber are ignited, as discussed earlier. The ignition of fuel vapors increases the number of ions present within the combustion chamber. Furthermore, during various stages of combustion, varying concentration of ions are present within the combustion chamber.

By measuring the ion content within the combustion chamber, the MBT timing of the ignition coil 10 can be determined. More specifically, the amount of current that flows from the first post 136 to the second post 138 is proportional to the ionization content within the combustion chamber. Therefore, if a bias current 142 is sent from the ICSI circuit 28 into the secondary winding 14 and to the first post 136, an ionization current 144 flows across the two posts 136, 138, and the ionization current if proportional to the ionization content within the combustion chamber. Therefore, the ionization current 144 generates a profile of the events occurring in the combustion chamber, such as the peak pressure within the ignition chamber, which can be analyzed in order to detect and control the MBT timing of the ignition coil 10.

The ionization current 144 is sent back to the PCM 34 via an ionization signal, such as the feed back signal 146. The feed back signal 146 is generated by any appropriate means, such as by setting up a circuit (not shown) to create a mirror current that emulates the ionization current 144 but has an opposite direction.

In another embodiment of the present invention, the connections 58, 74, 82, 52, 104, 90 are completed with surface mount connections (not shown) between the circuit board and the respective components, such as the primary winding 16, the secondary winding 14, the ICSI circuit 28, the IGBT 30, the battery 32, the PCM 34, and the electrically grounded section of the vehicle 38. In this embodiment, the circuit board does not include openings. Rather, the circuit board in this embodiment includes connection portions that engage respective connection portions of the respective components. More specifically, the circuit board includes a plurality of conductive connection portions that are embedded within the circuit board so the circuit board has a relatively flat surface. Alternatively, the connective portions may be located on top of the circuit board such as to form protrusions on the circuit board surface, or the portions may be formed within channels in the circuit board such as to form indentations in the circuit board surface. The connection portions of the respective components preferably extend substantially perpendicularly towards the circuit board. During manufacturing of this embodiment, the circuit board connection portions and the connection portions of the respective components are soldered together to form the connections 58, 74, 82, 52, 104, 90.

In yet another embodiment of the present invention, the connections 58, 74, 82, 52, 104, 90 are completed with clamp connections (not shown) between the circuit board and the respective components. More specifically, each of the connection portions of the respective components includes a pair of opposing contact portions in order to engage both sides of the circuit board. The distance between the pair of opposing contact portions is preferably approximately equal to the thickness of the circuit board in order to form a press-fit connection. The opposing contact portions are preferably surfaces that are substantially parallel to each other and substantially parallel to the circuit board in order to form a flush connection with the circuit board. Additionally, the opposing contact portions are preferably connected by a C-shaped structure, not unlike a C-clamp. A first contact portion in each pair (either the top contact portion or the bottom contact portion) is in electrical contact with the circuit board in order to complete the connections 58, 74, 82, 52, 104, 90. The second contact portion is preferably also in electrical contact with the circuit board. Alternatively, the second contact portion is merely provided to form the press-fit connection, and is not in electrical contact with the circuit board. Each pair of contact portions can be soldered to the circuit board, but it is not necessary.

It is therefore intended that the foregoing detailed description be regarded as illustrated rather than limiting, and that it be understood that it is the following claims, including all equivalents, that are intended to define the spirit and scope of this invention.

What is claimed is:

1. An ignition coil for an internal combustion engine, the ignition coil in electrical connection with a control module, an electrical power supply, and a spark plug having a pair of gap posts, the ignition coil comprising:

a primary winding in electrical connection with the electrical power supply such that an electrical current travels through the primary winding;

a secondary winding located adjacent to the primary winding and in electrical connection with the spark plug, the secondary winding inducing a second electrical current between the pair of gap posts based on the electrical current traveling through the primary winding, and the secondary winding including an upstanding pin and;

an ionization current sensing integrated (ICSI) circuit in electrical connection with the secondary winding via an ionization connection, the ICSI circuit configured to generate an ionization signal based on the second electrical current between the pair of gap posts, the ICSI circuit including an upstanding pin; and a circuit board having a secondary winding opening and an ICSI circuit opening, the circuit board being positioned such that the upstanding pin of the secondary winding extends through the secondary winding opening and the upstanding pin of the ICSI circuit extends through the ICSI circuit opening in order to form the ionization connection.

2. The ignition coil in claim 1, wherein the ionization signal is based on a third electrical current, wherein the third electrical current travels between the pair of gap posts.

3. The ignition coil in claim 2, further comprising:
a power supply connection electrically connecting the power supply and the primary winding; and
an upstanding pin in electrical connection with the electrical power supply,
wherein the primary winding further includes an upstanding pin, and the circuit board further includes an electrical power supply opening and a primary winding opening,
wherein the circuit board is positioned such that the upstanding pin in electrical connection with the electrical power supply extends through the electrical power supply opening and the upstanding pin of the primary winding extends through the primary winding opening in order to form the power supply connection.

4. The ignition coil in claim 3, wherein the power supply connection is in electrical connection with the ICSI circuit,
wherein the ICSI circuit further includes a second upstanding pin and the circuit board further includes a second ICSI circuit opening, and
wherein the circuit board is positioned such that the second upstanding pin of the ICSI circuit extends through the second ICSI circuit opening in order to form the power supply connection.

5. The ignition coil in claim 4, further comprising:
a control signal connection electrically connecting the control module with the ICSI circuit in order to transmit a control signal from the control module to the ICSI circuit; and
an upstanding pin in electrical connection with the control module,
wherein the ICSI circuit further includes a third upstanding pin, and the circuit board further includes a third ICSI circuit opening and a control module opening,
wherein the circuit board is positioned such that the upstanding pin in electrical connection with the control module extends through the control module opening and the third upstanding pin of the ICSI circuit extends through the third ICSI circuit opening in order to form the control signal connection.

6. The ignition coil in claim 5, further comprising:
a feedback signal connection electrically connecting the ICSI circuit with the control module in order to transmit a control signal from the ICSI circuit to the control module; and
a second upstanding pin in electrical connection with the control module,
wherein the ICSI circuit further includes a fourth upstanding pin, and the circuit board further includes a fourth ICSI circuit opening and a second control module opening,
wherein the circuit board is positioned such that the second upstanding pin in electrical connection with the control module extends through the second control module opening and the fourth upstanding pin of the ICSI circuit extends through the fourth ICSI circuit opening in order to form the feedback signal connection.

7. The ignition coil in claim 6, further comprising a transistor connection electrically connecting the primary winding with a transistor,
wherein primary winding further includes a second upstanding pin, the transistor includes an upstanding pin, and the circuit board further includes a second primary winding opening and a transistor opening, and
wherein the circuit board is positioned such that the second upstanding pin of the primary winding extends through the second primary winding opening and the upstanding pin of the transistor extends through the transistor opening in order to form the transistor connection.

8. The ignition coil in claim 7, further comprising a ground connection that is electrically grounded.

9. The ignition coil in claim 8, further comprising an electrically grounded upstanding pin,
wherein the transistor includes a second upstanding pin and the circuit board further includes a second transistor opening and a ground opening, and
wherein the circuit board is positioned such that the second upstanding pin of the transistor extends through the second transistor opening and the electrically grounded upstanding pin extends through the ground opening in order to form the ground connection.

10. The ignition coil in claim 9, wherein at least one of the ICSI circuit and the transistor is located within a case,
wherein the case includes an upstanding pin and the circuit board includes a case opening, and
wherein the circuit board is positioned such that the upstanding pin of the case extends through the case opening in order to form the ground connection.

11. An ignition coil for an internal combustion engine, the ignition coil in electrical connection with a control module, an electrical power supply, and a spark plug having a pair of gap posts, the ignition coil comprising:
a primary winding in electrical connection with the electrical power supply such that an electrical current travels through the primary winding;
a secondary winding located adjacent to the primary winding and in electrical connection with the spark plug, the secondary winding inducing a second electrical current between the pair of gap posts based on the electrical current traveling through the primary winding, and the secondary winding including a connection portion and;
an ionization current sensing integrated (ICSI) circuit in electrical connection with the secondary winding via an ionization connection, the ICSI circuit configured to generate an ionization signal based on the second electrical current between the pair of gap posts, the ICSI circuit including a connection portion; and
a circuit board having a secondary winding connection portion and an ICSI connection portion, the circuit board being positioned such that the connection portion of the secondary winding engages the secondary winding connection portion of the circuit board and the connection portion of the ICSI circuit engages the ICSI connection portion of the circuit board in order to form the ionization connection.

12. The ignition coil in claim 11, wherein the ionization signal is based on a third electrical current, wherein the third electrical current travels between the pair of gap posts.

13. The ignition coil in claim 12, further comprising:
a power supply connection electrically connecting the power supply and the primary winding; and
a connection portion in electrical connection with the electrical power supply,
wherein the primary winding further includes a connection portion, and the circuit board further includes an electrical power supply connection portion and a primary winding connection portion, wherein the circuit board is positioned such that the connection portion in electrical connection with the electrical power supply engages the electrical power supply connection portion of the circuit board and the connection portion of the primary winding engages the primary winding connection portion of the circuit board in order to form the power supply connection.

14. The ignition coil in claim 13, wherein the power supply connection is in electrical connection with the ICSI circuit,
- wherein the ICSI circuit further includes a second connection portion and the circuit board further includes a second ICSI connection portion, and
- wherein the circuit board is positioned such that the connection portion of the ICSI circuit engages the second ICSI connection portion of the circuit board in order to form the power supply connection.

15. The ignition coil in claim 14, further comprising:
- a control signal connection electrically connecting the control module with the ICSI circuit in order to transmit a control signal from the control module to the ICSI circuit; and
- a connection portion in electrical connection with the control module,
- wherein the ICSI circuit further includes a third connection portion, and the circuit board further includes a third ICSI connection portion and a control module connection portion,
- wherein the circuit board is positioned such that the connection portion in electrical connection with the control module engages the control module connection portion of the circuit board and the third connection portion of the ICSI circuit engages the third ICSI connection portion of the circuit board in order to form the control signal connection.

16. The ignition coil in claim 15, further comprising:
- a feedback signal connection electrically connecting the ICSI circuit with the control module in order to transmit a control signal from the ICSI circuit to the control module; and
- a second connection portion in electrical connection with the control module,
- wherein the ICSI circuit further includes a fourth connection portion, and the circuit board further includes a fourth ICSI connection portion and a second control module connection portion,
- wherein the circuit board is positioned such that the second connection portion in electrical connection with the control module engages the second control module connection portion of the circuit board and the fourth connection portion of the ICSI circuit engages the fourth ICSI connection portion in order to form the feedback signal connection.

17. The ignition coil in claim 16, further comprising a transistor connection electrically connecting the primary winding with a transistor,
- wherein primary winding further includes a second connection portion, the transistor includes a connection portion, and the circuit board further includes a second primary winding connection portion and a transistor connection portion, and
- wherein the circuit board is positioned such that the second connection portion of the primary winding engages the second primary winding connection portion of the circuit board and the connection portion of the transistor engages the transistor connection portion in order to form the transistor connection.

18. The ignition coil in claim 17, further comprising a ground connection that is electrically grounded.

19. The ignition coil in claim 18, further comprising an electrically grounded connection portion,
- wherein the transistor includes a second connection portion and the circuit board further includes a second transistor connection portion and a ground opening, and
- wherein the circuit board is positioned such that the second connection portion of the transistor engages the second transistor connection portion of the circuit board and the electrically grounded connection portion engages the ground connection portion in order to form the ground connection.

20. The ignition coil in claim 19, wherein at least one of the ICSI circuit and the transistor is located within a case,
- wherein the case includes a connection portion and the circuit board includes a case connection portion, and
- wherein the circuit board is positioned such that the connection portion of the case engages the case connection portion in order to form the ground connection.

* * * * *